United States Patent
Yang et al.

(10) Patent No.: US 8,211,797 B2
(45) Date of Patent: Jul. 3, 2012

(54) METAL WIRING LAYER AND METHOD OF FABRICATING THE SAME

(75) Inventors: Dong-Ju Yang, Seoul (KR); Shin-Il Choi, Seoul (KR); Sang-Gab Kim, Seoul (KR); Min-Seok Oh, Yongin-si (KR); Hong-Kee Chin, Suwon-si (KR); Ki-Yeup Lee, Yongin-si (KR); Yu-Gwang Jeong, Yongin-si (KR); Seung-Ha Choi, Siheung-si (KR)

(73) Assignee: Samsung Electronics Co., Ltd. (KR)

( * ) Notice: Subject to any disclaimer, the term of this patent is extended or adjusted under 35 U.S.C. 154(b) by 77 days.

(21) Appl. No.: 12/290,594

(22) Filed: Oct. 31, 2008

(65) Prior Publication Data

US 2009/0115066 A1    May 7, 2009

(30) Foreign Application Priority Data

Nov. 5, 2007 (KR) .................. 10-2007-0112342

(51) Int. Cl.
*H01L 21/44* (2006.01)
(52) U.S. Cl. .................. 438/666; 257/E21.585; 438/618
(58) Field of Classification Search .................. 257/773, 257/E21.585; 438/618, 666
See application file for complete search history.

(56) References Cited

U.S. PATENT DOCUMENTS

| | | | | |
|---|---|---|---|---|
| 2007/0077755 A1* | 4/2007 | Hong | | 438/627 |
| 2008/0057672 A1* | 3/2008 | Rossi et al. | | 438/437 |
| 2008/0237888 A1* | 10/2008 | Hayasaka et al. | | 257/777 |
| 2009/0111061 A1* | 4/2009 | Chau et al. | | 430/323 |

FOREIGN PATENT DOCUMENTS

| | | | |
|---|---|---|---|
| JP | 10-268343 | | 10/1998 |
| KR | 2002-0088446 | | 11/2002 |
| KR | 2002088445 A | * | 11/2002 |
| KR | 2002088446 A | * | 11/2002 |
| KR | 2007-0001548 | | 1/2007 |

* cited by examiner

*Primary Examiner* — William D Coleman
*Assistant Examiner* — Christine Enad
(74) *Attorney, Agent, or Firm* — Innovation Counsel LLP

(57) ABSTRACT

A metal wiring layer and a method of fabricating the metal wiring layer are provided. The method includes forming a dielectric layer on a substrate, forming a plurality of dielectric layer patterns and holes therein on the substrate by etching part of the dielectric layer, with a cross sectional area of the holes in the dielectric layer patterns decreasing with increasing distance away from the substrate and the holes exposing the substrate, forming a trench by etching a portion of the substrate exposed through the holes in the dielectric layer patterns, and forming a metal layer which fills the trench and the holes in the dielectric layer patterns. Thus, it is possible to prevent the occurrence of an edge build-up phenomenon by forming a metal layer in a plurality of holes in the dielectric layer patterns having a cross sectional area decreasing with increasing distance away from the substrate. Therefore, it is possible to prevent the transmittance of a liquid crystal layer from decreasing due to a failure to properly fill liquid crystal molecules in the liquid crystal layer, and thus to increase the quality of display.

20 Claims, 12 Drawing Sheets

METAL WIRING LAYER AND METHOD OF FABRICATING THE SAME

CROSS-REFERENCE TO RELATED APPLICATION

This application claims priority to and the benefit of Korean Patent Application No. 10-2007-0112342 filed on Nov. 5, 2007 in the Korean Intellectual Property Office, the disclosure of which is incorporated herein by reference in its entirety.

BACKGROUND

1. Technical Field

One or more embodiments of the present invention generally relate to a metal wiring layer, and a method of fabricating the same. More particularly, one or more embodiments of the present invention relate to a buried-type metal wiring layer, and a method of fabricating the same.

2. Description of the Related Art

As a flat panel display, a liquid crystal display (LCD) includes a lower substrate on which a plurality of gate lines, a plurality of data lines, a plurality of pixel electrodes and a plurality of thin-film transistors (TFTs) are formed, an upper substrate on which a common electrode is formed, and a liquid crystal layer which is interposed between the lower substrate and the upper substrate. An LCD generates an electric field in a liquid crystal layer by applying a voltage to a plurality of pixel electrodes and a common electrode, and thus displays an image by determining the alignment of liquid crystal molecules in the liquid crystal layer and by controlling the polarization of incident light.

In order to realize a large-scale LCD having high resolution, it is necessary to reduce the resistance of metal wiring. To accomplish this, metal wiring may be formed of a low-resistance material such as copper (Cu) or silver (Ag). In order to further reduce the resistance of metal wiring, the width or the thickness of metal wiring must be increased.

However, as the width of metal wiring increases, the area of pixel regions decreases, and thus, the transmittance of a liquid crystal layer deteriorates. Furthermore, as the thickness of metal wiring increases, a step difference between a substrate and the metal wiring may increase. For example, if a gate line including a gate electrode is formed to a thickness of 4000-5000 Å, a huge step difference may be generated between the substrate and the gate line. The step difference between the substrate and the gate line may further increase by laying source and drain electrodes over the gate electrode. When a lower substrate has such a huge step difference, a liquid crystal layer may not be properly filled with liquid crystal molecules. As a result, the transmittance of the liquid crystal layer may become irregular due to an irregular alignment of liquid crystal molecules in the liquid crystal layer, and the quality of display may deteriorate.

In order to address this problem, methods of forming a buried-type metal wiring layer have been suggested, in which a trench is formed on a substrate and a metal wiring layer is formed in the trench through electroplating. These methods, however, may result in various defects such as an edge build-up phenomenon, in which a metal layer is excessively grown along the edges of a trench and thus the metal layer becomes thicker near the edges than at other regions in the trench.

SUMMARY

One or more embodiments of the present invention provide a metal wiring layer and a method of forming the same capable of preventing the occurrence of a build-up phenomenon during the formation of a buried-type metal wiring layer in a trench on a substrate, and thus capable of reducing a step difference.

One or more embodiments of the present invention also provide a metal wiring layer and a method of forming the same capable of preventing the occurrence of an edge build-up phenomenon in a buried-type metal wiring layer by forming a dielectric layer on a substrate, patterning the dielectric layer through etching so as to have a hole in the dielectric layer having a cross sectional area decreasing with increasing distance away from the substrate, and then forming a trench in the substrate through etching.

According to an exemplary embodiment of the present invention, a metal wiring layer comprises: a substrate on which a trench is formed, with a cross sectional area of the trench decreasing with increasing distance into the substrate; a dielectric layer pattern and a hole therein formed on the substrate through patterning, wherein the hole in the dielectric layer pattern is connected with the trench and a cross sectional area of the hole decreases with increasing distance away from the substrate; and a metal layer which fills the trench and the hole in the dielectric layer pattern.

In accordance with one embodiment of the present invention, the sidewall of the hole in the dielectric layer pattern may form an internal angle of about 90° or less with the substrate.

In accordance with another embodiment of the present invention, the sidewall of the hole in the dielectric layer pattern may form an internal angle of about 5-85° with the substrate.

In accordance with another embodiment of the present invention, the height of the metal layer may be the same as or less than the height of the dielectric layer pattern.

According to another exemplary embodiment of the present invention, a method of forming a metal wiring layer comprises: forming a dielectric layer on a substrate; forming a dielectric layer pattern and a hole therein on the substrate by etching part of the dielectric layer, wherein the hole in the dielectric layer pattern extends to the substrate and a cross sectional area of the hole decreases with increasing distance away from the substrate; forming a trench by etching a portion of the substrate exposed through the hole in the dielectric layer pattern; and forming a metal layer which fills the trench and the hole in the dielectric layer pattern.

In accordance with one embodiment of the present invention, the forming of the dielectric layer pattern and the hole therein may comprise forming a photosensitive layer pattern on the dielectric layer and etching the dielectric layer so as to generate undercuts below the photosensitive layer pattern.

In accordance with another embodiment of the present invention, the dielectric layer pattern and the hole therein may be formed by etching the dielectric layer using a dry etching method involving the use of plasma.

In accordance with another embodiment of the present invention, the sidewall of the hole in the dielectric layer pattern may form an internal angle of about 90° or less with the substrate.

In accordance with another embodiment of the present invention, the sidewall of the hole in the dielectric layer pattern may form an internal angle of about 5-85° with the substrate.

In accordance with another embodiment of the present invention, the forming of the dielectric layer pattern and the hole therein may also comprise adjusting etch slope by adjusting at least one of pressure, high-frequency power, the amount of etching gas, and etching duration.

In accordance with another embodiment of the present invention, a cross sectional area of the trench may decrease with increasing distance into the substrate.

In accordance with another embodiment of the present invention, the trench may be formed by using a lower pressure, a higher frequency power, and a smaller amount of etching gas than those used in the etching of the dielectric layer.

In accordance with another embodiment of the present invention, the forming of the metal layer may include forming a seed layer in the trench and performing electroplating.

In accordance with another embodiment of the present invention, the height of the metal layer may be the same as or less than the height of the dielectric layer pattern.

According to another exemplary embodiment of the present invention, a metal wiring layer comprises: a substrate; a dielectric layer pattern and a hole therein formed on the substrate through patterning, wherein the hole in the dielectric layer pattern extends to the substrate and a cross sectional area of the hole decreases with increasing distance away from the substrate; and a metal layer which is formed in the hole in the dielectric layer pattern.

In accordance with one embodiment of the present invention, the sidewall of the hole in the dielectric layer pattern may form an internal angle of about 90° or less with the substrate.

In accordance with another embodiment of the present invention, the sidewall of the hole in the dielectric layer pattern may form an internal angle of about 5-85° with the substrate.

In accordance with another embodiment of the present invention, the height of the metal layer may be the same as or less than the height of the dielectric layer pattern.

According to another exemplary embodiment of the present invention, a metal wiring layer comprises: a substrate on which a trench is formed; a dielectric layer pattern and a hole therein formed on the substrate through patterning, wherein the hole in the dielectric layer pattern is connected with the trench and a cross sectional area of the hole decreases with increasing distance away from the substrate; and a metal layer which fills the trench and the hole in the dielectric layer pattern.

In accordance with one embodiment of the present invention, the sidewall of the hole in the dielectric layer pattern may form an internal angle of about 90° or less with the substrate.

In accordance with another embodiment of the present invention, the sidewall of the hole in the dielectric layer pattern may form an internal angle of about 5-85° with the substrate.

In accordance with another embodiment of the present invention, the height of the metal layer may be the same as or less than the height of the dielectric layer pattern.

According to another exemplary embodiment of the present invention, a metal wiring layer comprises: a substrate on which a trench is formed; a dielectric layer pattern and a hole therein formed on the substrate, with the hole overlapping with the trench; and a metal layer which fills the trench and the hole in the dielectric layer pattern, wherein a cross sectional area of the metal layer decreases with increasing distance away from the top surface of the substrate.

In accordance with another embodiment of the present invention, a seed layer may be formed on the bottom surface of the trench.

In accordance with another embodiment of the present invention, the metal layer is formed of aluminum (Al), copper (Cu), neodymium (Nd), silver (Ag), chromium (Cr), titanium (Ti), tantalum (Ta), molybdenum (Mo), or an alloy thereof.

BRIEF DESCRIPTION OF THE DRAWINGS

The above and other advantages of embodiments of the present invention will become more apparent by describing in detail exemplary embodiments thereof with reference to the attached drawings, in which.

DETAILED DESCRIPTION OF THE EXEMPLARY EMBODIMENTS

Figure 1A:
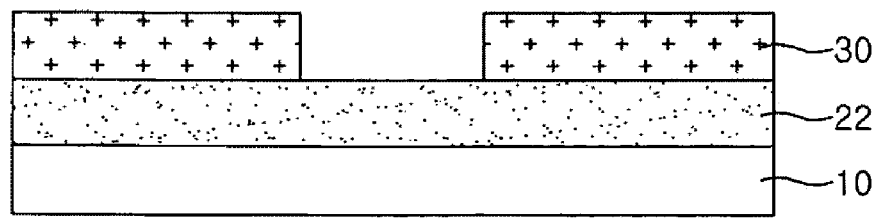
FIGS. 1A through 1F illustrate cross-sectional views for explaining a method of fabricating a metal wiring layer according to one or more embodiment of the present invention.

Embodiments of the present invention will now be described more fully with reference to the accompanying drawings, in which one or more exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it may be directly connected or coupled to the other element, or intervening elements may be present. In contrast, when an element is referred to as being "directly connected" or "directly coupled" to another element, there are no intervening elements present. Like reference numerals refer to like elements throughout. As used herein, the term "and/or" includes any and all combinations of one or more of the associated listed items.

It will be further understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments of the invention only and is not intended to be limiting of other embodiments of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as they are commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, spatially relative terms such as "below," "beneath," "lower," "above," "upper" and the like, may be used herein to describe one element's relationship to another element as illustrated in the accompanying figures. It will be understood that the spatially relative terms are intended to encompass different orientations of the device in addition to the orientation depicted in the accompanying figures. For example, if the device in the accompanying figures is turned over, elements described as being on the "lower" side of other elements would then be oriented on the "upper" sides of the other elements. Similarly, if the device in one of the figures is turned over, elements described as "below" or "beneath" other elements would then be oriented "above" the other elements. Therefore, the exemplary terms "below" and "beneath" may encompass both an orientation of above and below.

FIGS. 1A through 1F illustrate cross-sectional views for explaining a method of fabricating a metal wiring layer according to one or more embodiments of the present invention. Referring to FIG. 1A, a dielectric layer 22 may be formed on a substrate 10, and a photosensitive layer may be formed on the dielectric layer 22. The substrate 10 may be an insulating substrate such as a plastic substrate, which may be formed of polyethylene (PE), polyethylene sulfite (PES), polyethylene terephthalate (PET), or polyethylene naphthalate (PEN), or a glass substrate. The dielectric layer 22 may be formed of a material having etching selectivity to the substrate 10 and the photosensitive layer. The dielectric layer 22 may include a silicon oxide ($SiO_2$) layer or a silicon nitride (SiNx) layer. The thickness of the dielectric layer 22 may be determined by a desired thickness of a metal wiring layer. For example, the dielectric layer 22 may be formed to a thickness of about 2000-3000 Å. The photosensitive layer may be patterned by performing light exposure and development using a mask (not shown). As a result, a plurality of photosensitive layer patterns 30, which partially exposes the dielectric layer 22, may be obtained.

Figure 1B:
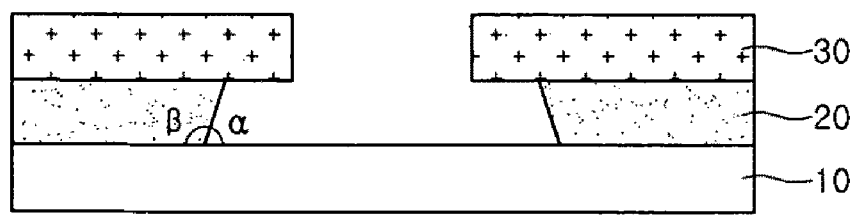

Referring to FIGS. 1A and 1B, the dielectric layer 22 may be etched using the photosensitive layer patterns 30 as etching masks and using a dry etching method, in particular, a dry etching method involving the use of plasma, thereby forming a plurality of dielectric layer patterns 20. In this case, the dielectric layer 22 may be excessively etched so that undercuts may be formed below the photosensitive layer patterns 30. As a result, a plurality of dielectric layer patterns 20 may be obtained. As used hereinafter, the dielectric layer patterns 20 refer to the dielectric layer 22 remaining after etching, and the holes in the dielectric layer patterns 20 refer to the holes or space created when part of the dielectric layer 22 is etched away. The holes in the dielectric layer patterns 20 may have a cross sectional area decreasing with increasing distance away from the substrate 10. An internal angle a between the substrate 10 and the holes in the dielectric layer patterns 20 may be about 90° or less, in particular, between 5-85°. If the internal angle a is less than 5°, a metal layer may not be properly formed in the undercuts. On the other hand, if the internal angle a is more than 85°, a build-up phenomenon may occur. In order to obtain a hole in the dielectric layer patterns 20 having a cross sectional area decreasing with increasing distance away from the substrate 10 through etching, a high-frequency power of 500-1500 W may be applied to an upper electrode of a plasma dry etching equipment at a pressure of 200-1000 mTorr. The dielectric layer 22 may be etched using a mixture of a fluorine-based gas, an oxygen gas and an inert gas as an etching gas. For example, the dielectric layer 22 may be etched for about 30-50 seconds using 200-500 sccm of an $SF_6$ gas, 50-200 sccm of an oxygen gas and 100-300 sccm of an inert gas. In short, in order to obtain holes in the dielectric layer patterns 20 having a cross sectional area decreasing with increasing distance away from the substrate 10, the etching of the dielectric layer 22 may be performed by appropriately adjusting at least one of pressure, high-frequency power, the amount of etching gas, and etching duration.

Figure 1C:
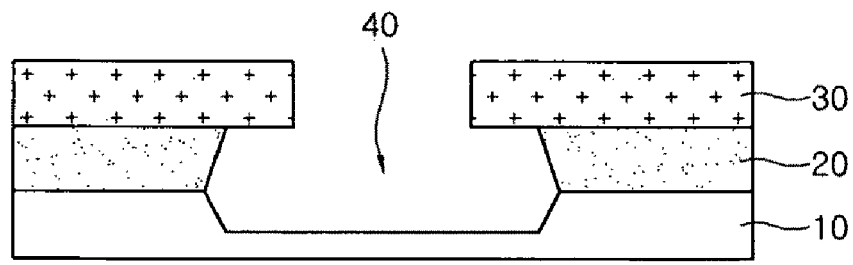

Referring to FIG. 1C, the substrate 10 may be etched, thereby forming a trench 40. More specifically, the substrate 10 may be etched using a dry etching method, in particular, a dry etching method involving the use of plasma. The trench 40 may have a cross sectional area decreasing with increasing distance into the substrate 10, whereas the hole in the dielectric layer patterns 20 may have a cross sectional area decreasing with increasing distance away from the substrate 10. The trench 40 may be formed to a depth of about 1000-2000 Å in consideration of the amount by which the photosensitive layer patterns 30 are consumed during the etching of the substrate 10. The etching of the substrate 10 for forming the trench 40 may be performed using a lower pressure, a higher frequency power, and a smaller amount of etching gas than those used for the etching of the dielectric layer 22. For example, the substrate 10 may be etched for about 80-100 seconds by applying a high-frequency power of 2500-4000 W and a high-frequency power of 1500-2500 W to the upper and lower electrodes, respectively, at a pressure of 10-50 mTorr using a mixture of a fluorine-based gas, an oxygen gas and an inert gas as an etching gas, in particular, a mixture of 50-100 sccm of an $SF_6$ gas, 10-50 sccm of an oxygen gas and 30-100 sccm of an inert gas.

Figure 1D:
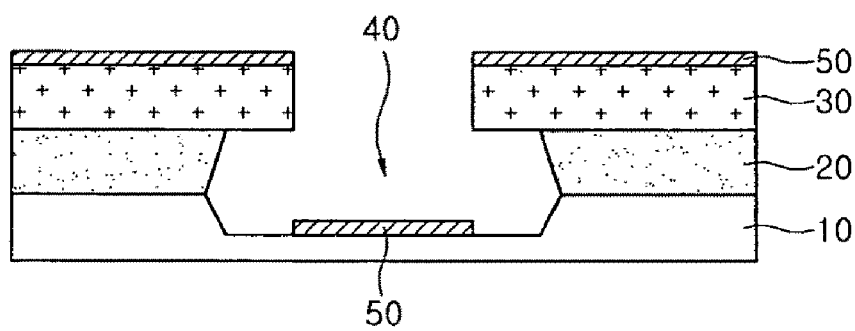

Referring to FIG. 1D, a seed layer 50 may be formed of a metal on the photosensitive layer patterns 30 and on a portion of the substrate 10 exposed between the dielectric layer patterns 20 by using a sputtering method. The seed layer 50 may be formed on the bottom surface and/or side surface of the trench 40. Alternatively, the seed layer 50 may be formed on the sidewall of the dielectric layer pattern 20. The seed layer 50 may be formed of molybdenum (Mo), copper (Cu), aluminum (Al), or titanium (Ti) to a thickness of 300-700 Å.

Figure 1E:
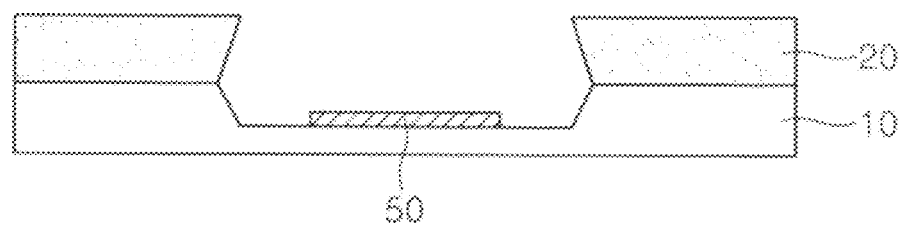

Referring to FIG. 1E, the photosensitive layer patterns 30 and portions of the seed layer 50 on the photosensitive layer patterns 30 may be removed by performing a lift-off operation. More specifically, the substrate 10, on which the seed layer 50 is formed, may be put in a photosensitive layer solvent so that the photosensitive layer solvent may infiltrate between the substrate 10 and the photosensitive layer patterns 30, and that the photosensitive layer patterns 30 may be lifted off from the substrate 10. When the photosensitive layer patterns 30 are lifted off from the substrate 10, portions of the seed layer 50 on the photosensitive layer patterns 30 are removed along with the photosensitive layer patterns 30. Therefore the seed layer 50 is formed on the bottom surface of the trench 40.

Figure 1F:
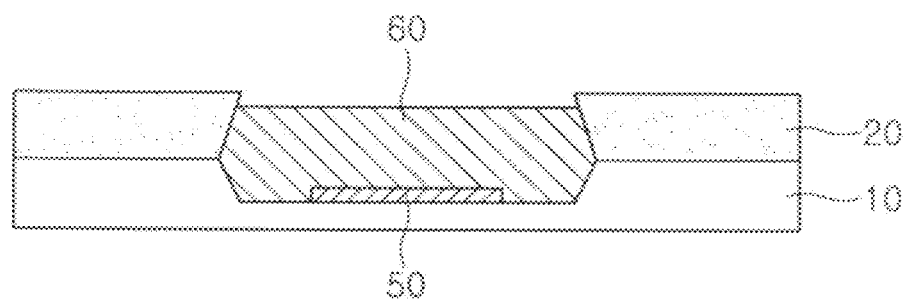

Referring to FIG. 1F, a metal layer 60 may be formed on the exposed portion of the substrate 10 by performing electroplating. More specifically, an electrode rod, which is formed of a desired metal material (e.g., copper), and the substrate 10 may be put in an electrolyte solution containing metal ions (e.g., a copper sulfide ($CuSO_4$) solution), and a negative voltage and a positive voltage may be applied to the substrate 10 and the electrode rod, respectively. Then, an oxidation reaction may occur at the electrode rod, and thus, metal ions and electrons may be generated. The metal ions may melt in the electrolyte solution, and the electrons may gather on the substrate 10 and may react with the metal ions in the electrolyte solution, thereby causing a reduction reaction. As a result, the metal layer 60 may be formed on the substrate 10. The metal layer 60 may be formed of metal materials including but not limited to copper, or various alloys. In this manner, the metal layer 60 may be grown from the seed layer 50 and may extend from the bottom of the trench 40 almost to the top of the dielectric layer patterns 20. Since the holes in the dielectric layer patterns 20 have a cross sectional area decreasing with increasing distance away from the substrate 10, the metal layer 60 may be prevented from being excessively grown along the lateral surfaces of the dielectric layer patterns 20, and may thus be formed to a uniform thickness. Therefore, no edge build-up may occur. The height of the metal layer 60 may be less than the height of the dielectric layer patterns 20. For example, the height of the metal layer 60 may be about 500 Å less than the height of the dielectric layer patterns 20. The metal layer 60 has a cross sectional area decreasing with increasing distance away from the top surface of the substrate 10.

In the exemplary embodiment of FIGS. 1A through 1F, the holes in the dielectric layer patterns 20 have a cross sectional area decreasing with increasing distance away from the substrate 10, and the trench 40 has a cross sectional area decreasing with increasing distance into the substrate 10. However, embodiment of the present invention is not restricted to this exemplary embodiment. That is, the holes in the dielectric layer patterns 20 may have a cross sectional area decreasing with increasing distance away from the substrate 10, and the trench 40 may have any shape. For example, the trench 40 may be formed to have a straight shape by using the holes in the dielectric layer patterns 20, which may have a cross sectional area decreasing with increasing distance away from the substrate 10.

In the exemplary embodiment of FIGS. 1A through 1F, a buried-type metal wiring layer is formed on a substrate. However, embodiment of the present invention is not restricted to this exemplary embodiment. That is, a dielectric layer may be formed on a predetermined structure on a substrate. Thereafter, the dielectric layer may be patterned, thereby obtaining a plurality of holes in the dielectric layer patterns having a cross sectional area decreasing with increasing distance away from the predetermined structure. Thereafter, a seed layer and a metal layer may be formed. For example, a dielectric layer may be formed on a substrate, on which gate lines, a gate insulating layer, an active layer and an ohmic contact layer may be sequentially formed, and then patterned, thereby obtaining a plurality of dielectric layer patterns that partially expose the gate insulating layer and the ohmic contact layer. Thereafter, a seed layer and a metal layer may be formed. In this manner, it is possible to form data lines as buried-type metal wiring layers.

Figure 2A:
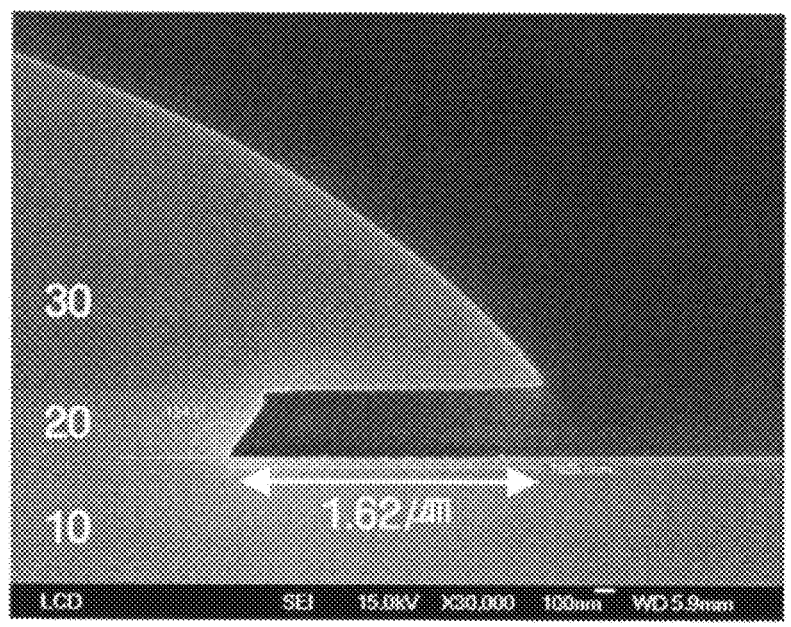
FIGS. 2A through 3B show photographs of the cross sections of metal wiring layers according to one or more embodiments of the present invention.
Figure 2B:
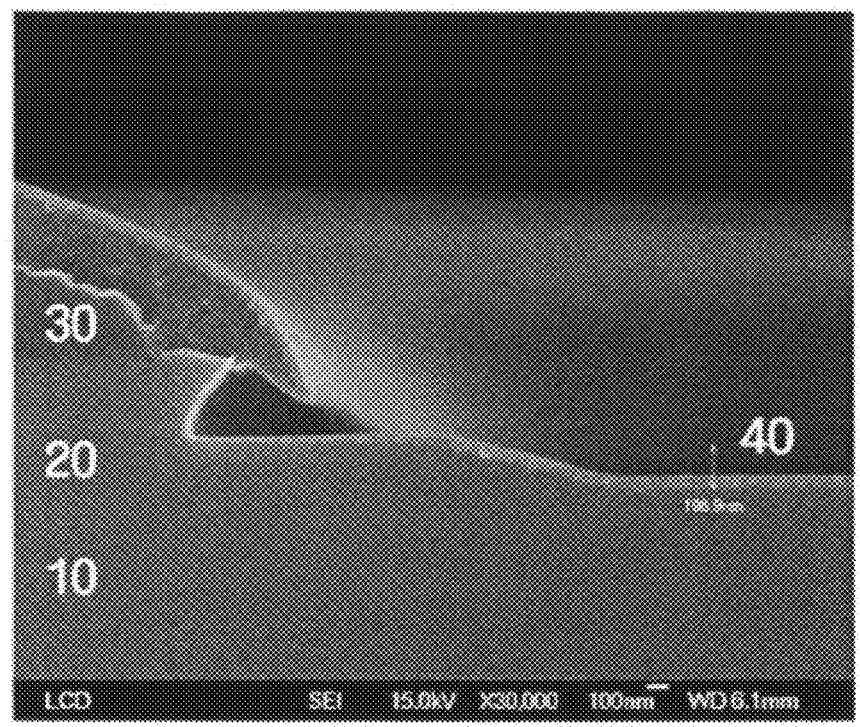
Figure 3A:
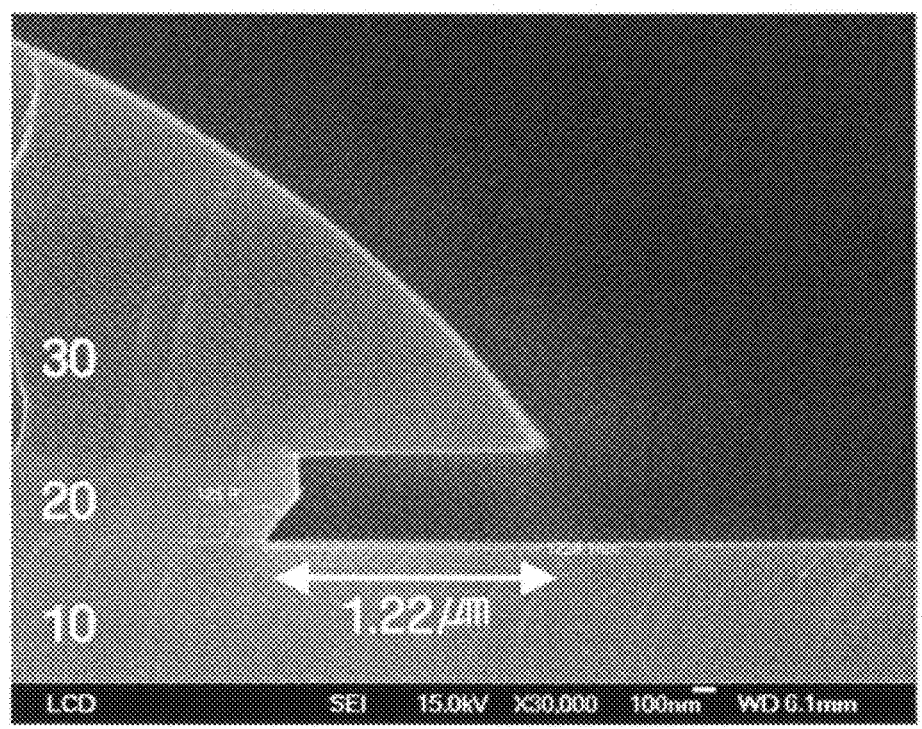
Figure 3B:
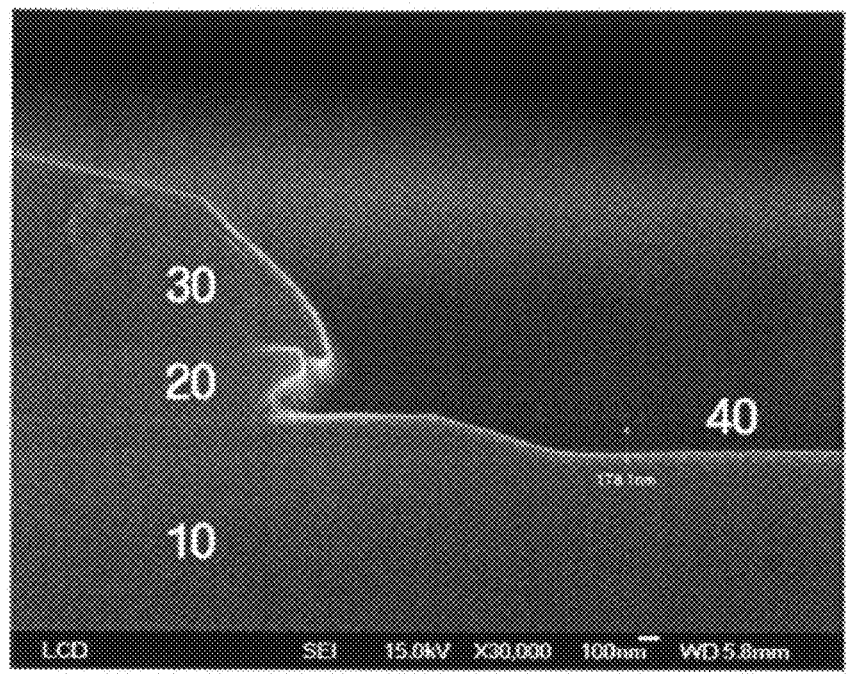

FIGS. 2A through 3B show photographs of the cross-sections of metal wiring layers according to one or more embodiments of the present invention. More specifically, FIG. 2A shows a photograph of the cross section of a dielectric layer pattern which is formed on a substrate through etching, and FIG. 2B shows a photograph of the cross section of a trench obtained by performing etching on the substrate, on which the dielectric layer pattern of FIG. 2A is formed. FIG. 3A shows a photograph of the cross section of a dielectric layer pattern, which is formed on a substrate by performing etching under almost the same conditions as those used to form the dielectric layer pattern of FIG. 2A except for a difference in pressure and etching duration, and FIG. 3B shows a photograph of the cross section of a trench obtained by performing etching on the substrate, on which the dielectric layer pattern of FIG. 3A is formed.

FIG. 2A shows a photograph of the cross section of a dielectric layer pattern 20 obtained by performing etching for 32 seconds while maintaining the distance between upper and lower electrodes of a plasma dry etching equipment to be 55 mm, applying a pressure of 400 mTorr and a high-frequency power of 800 W, and injecting 300 sccm of an $SF_6$ gas, 100 sccm of an oxygen gas, and 150 sccm of a helium gas. Referring to FIG. 2A, the hole in the dielectric layer pattern 20 includes an undercut having a depth of about 1.62 μm, a cross sectional area decreasing with increasing distance away from the substrate 10, and an external angle β between the sidewall of the dielectric layer pattern 20 and the substrate 10 of about 124.1°. The external angle β and the depth of the undercut may vary according to the duration of etching. For example, a hole in the dielectric layer pattern 20 which includes an undercut having a depth of about 2.06 μm, a cross sectional area decreasing with increasing distance away from the substrate 10, and an external angle β of about 126.6°, can be obtained by performing etching for 37 seconds under the same conditions as those used to form the dielectric layer pattern 20 of FIG. 2A.

FIG. 2B shows a photograph of a trench 40 obtained by performing etching on a substrate 10, on which the dielectric layer pattern 20 of FIG. 2A is formed, for 90 seconds while applying a pressure of 10 mTorr, a high-frequency power of 3000 W to an upper electrode and a high-frequency power of 2000 W to a lower electrode of the plasma dry etching equipment, and injecting 80 sccm of an $SF_6$ gas, 20 sccm of an oxygen gas, and 50 sccm of an argon gas. Referring to FIG. 2B, the trench 40 may be formed to a depth of about 2000 Å or less in consideration of the amount by which a photosensitive layer pattern 30 is consumed.

FIG. 3A shows a photograph of the cross section of a dielectric layer pattern 20 obtained by performing etching for 37 seconds while maintaining the distance between upper and lower electrodes of a plasma dry etching equipment to be 55 mm, applying a pressure of 200 mTorr and a high-frequency power of 800 W, and injecting 300 sccm of an $SF_6$ gas, 100 sccm of an oxygen gas, and 150 sccm of a helium gas. Referring to FIG. 3A, the hole in the dielectric layer pattern 20 includes an undercut having a depth of about 1.22 µm, a cross sectional area decreasing with increasing distance away from the substrate 10, and an external angle β between the sidewall of the dielectric layer pattern 20 and the substrate 10 of about 125.9°. The external angle β and the depth of the undercut may vary according to the duration of etching. For example, a hole in the dielectric layer pattern 20 which includes an undercut having a depth of about 1.38 µm, a cross sectional area decreasing with increasing distance away from the substrate 10, and an external angle β of about 124.3°, can be obtained by performing etching for 42 seconds under the same conditions as those used to form the dielectric layer pattern 20 of FIG. 3A. However, under both conditions, only the lower half of the hole in the dielectric layer pattern 20 has a cross sectional area decreasing with increasing distance away from the substrate 10, whereas the upper half of the hole in the dielectric layer pattern 20 has a straight shape. In this case, no build-up may occur if a metal layer is formed to have a height less than the height of the dielectric layer pattern 20.

FIG. 3B shows a photograph of a trench 40 obtained by performing etching on a substrate 10, on which the dielectric layer pattern 20 of FIG. 3A is formed, for 90 seconds while applying a pressure of 10 mTorr, a high-frequency power of 3000 W to an upper electrode and a high-frequency power of 2000 W to a lower electrode of the plasma dry etching equipment, and injecting 80 sccm of an $SF_6$ gas, 20 sccm of an oxygen gas, and 50 sccm of an argon gas. Referring to FIG. 3B, the trench 40 may be formed to a depth of 2000 Å or less in consideration of the amount by which a photosensitive layer pattern 30 is consumed.

Figure 4:
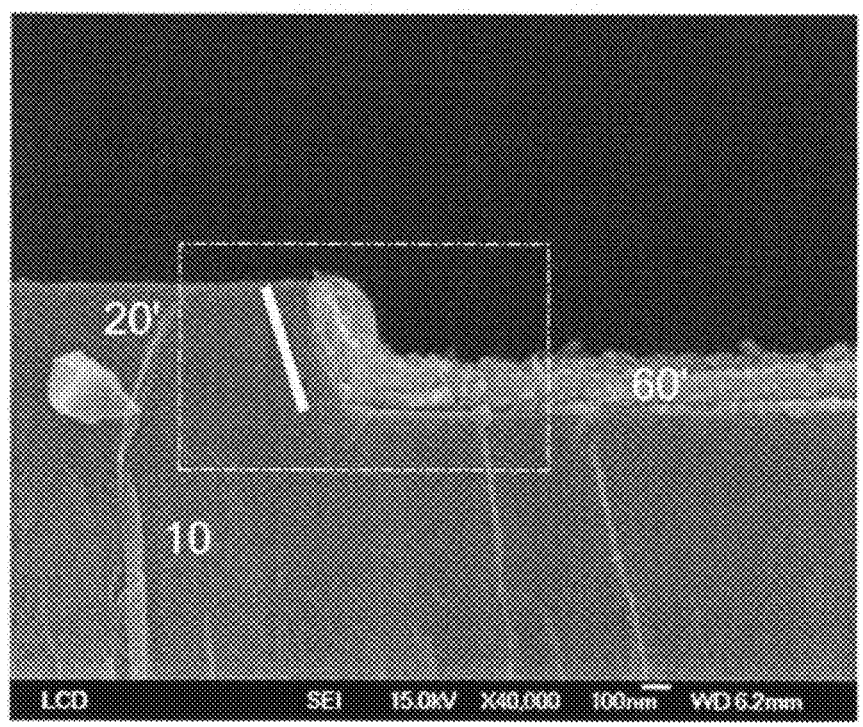
FIG. 4 shows a photograph of the cross section of a conventional metal wiring layer including a hole in the dielectric layer pattern having a cross sectional area increasing with increasing distance away from the substrate and a metal layer formed on the hole in the dielectric layer pattern.

FIG. 4 shows a photograph of the cross section of a conventional metal wiring layer including a hole in the dielectric layer pattern 20' having a cross sectional area increasing with increasing distance away from the substrate 10 and a metal layer 60' formed on the hole in the dielectric layer pattern 20'. Referring to FIG. 4, a build-up phenomenon occurs in which the metal layer 60' is excessively grown along the sidewall of the dielectric layer pattern 20'. In this case, the height of the metal layer 60' may be greater near the sidewall of the dielectric layer pattern 20' than anywhere else, and thus, the metal layer 60' may not be at a uniform thickness. Therefore, a step difference may be generated.

Figure 5:
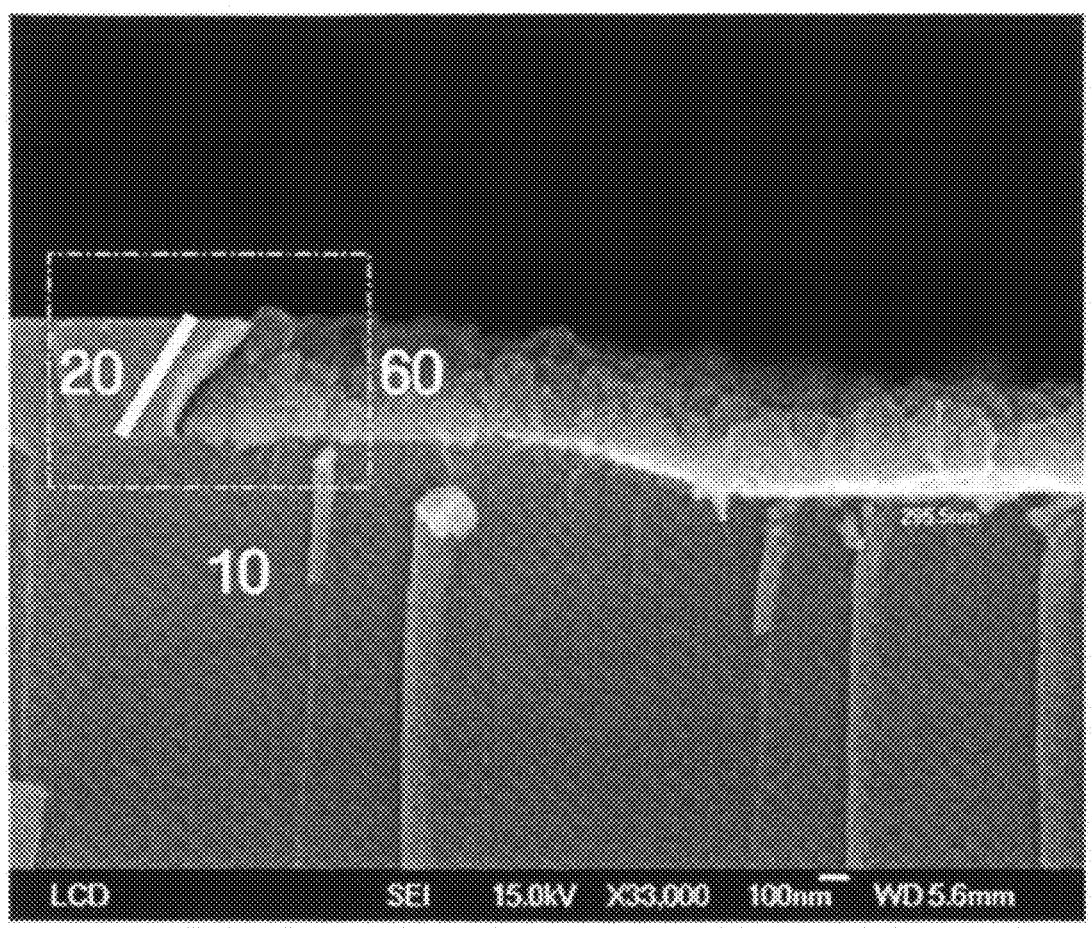
FIG. 5 shows a photograph of the cross section of a metal wiring layer according to one or more embodiments of the present invention, the metal wiring layer including a hole in the dielectric layer pattern having a cross sectional area decreasing with increasing distance away from the substrate and a metal layer formed on the hole in the dielectric layer pattern.

FIG. 5 shows a photograph of the cross section of a metal wiring layer including a hole in the dielectric layer pattern 20 having a cross sectional area decreasing with increasing distance away from the substrate 10 and a metal layer 60 formed on the hole in the dielectric layer pattern 20 according to one or more embodiments of the present invention. Referring to FIG. 5, no build-up phenomenon occurs due to the hole in the dielectric layer pattern 20 having a cross sectional area decreasing with increasing distance away from the substrate 10, and thus, the metal layer 60 may be formed to a uniform thickness. Therefore, no step difference may be generated.

In short, in the embodiment of FIGS. 1A through 1F, a plurality of holes in the dielectric layer patterns are formed on a substrate through patterning, a trench is formed on the substrate, and a metal layer is formed on the substrate so as to fill the trench. The embodiment of FIGS. 1A through 1F may be applied to the fabrication of gate lines of a liquid crystal display (LCD), thereby providing a lower substrate having no step difference. This embodiment of the invention will hereinafter be described in further detail.

Figure 6:
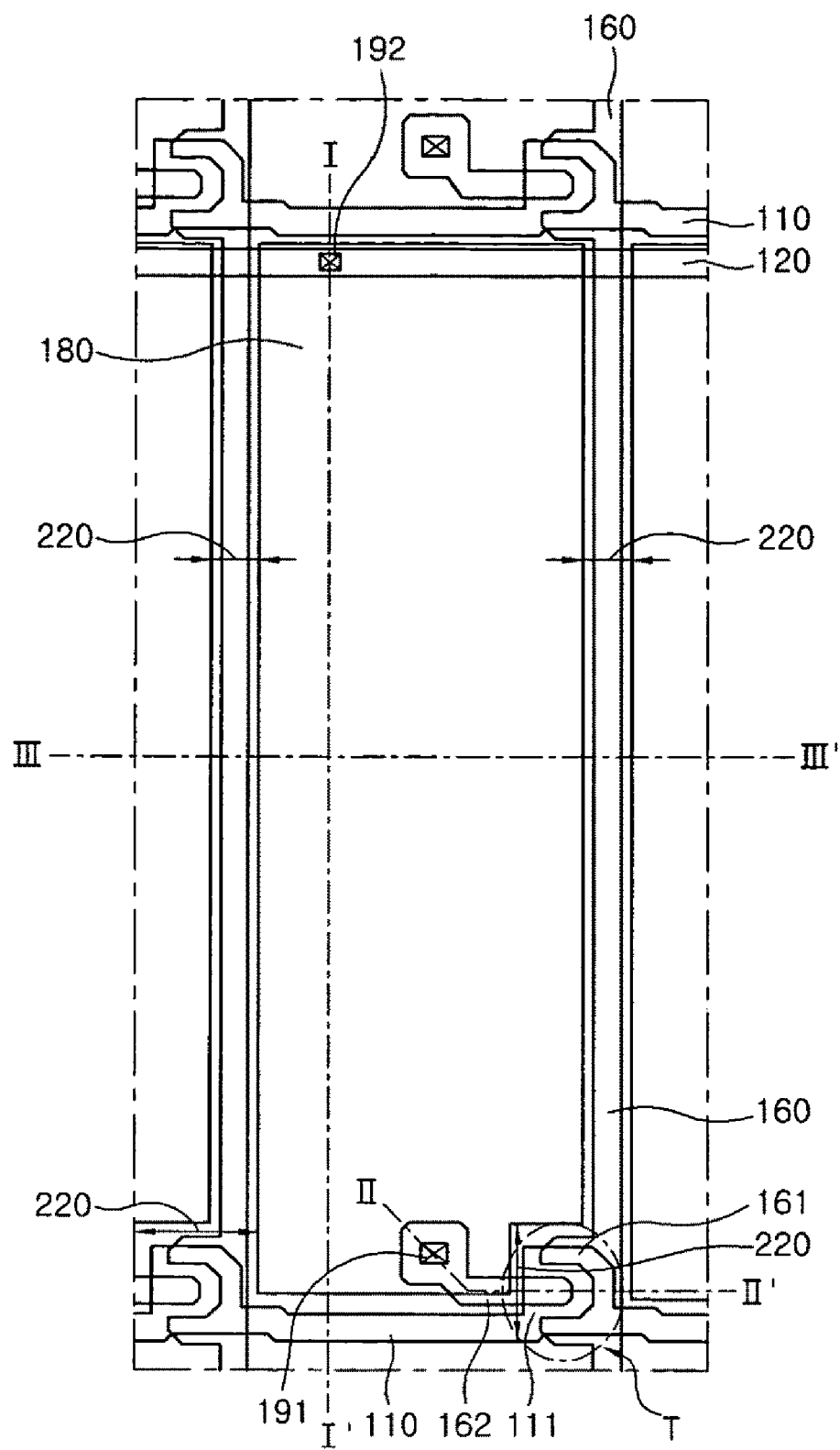
FIG. 6 illustrates a plan view of a liquid crystal display (LCD) according to one or more embodiments of the present invention.
Figure 7:
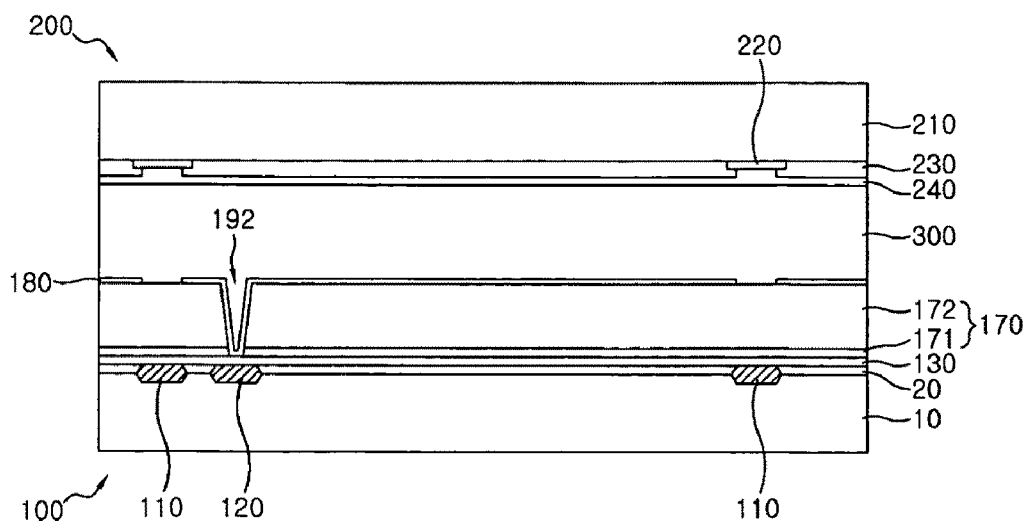
FIG. 7 illustrates a cross-sectional view taken along line I-I' of FIG. 6.
Figure 8:
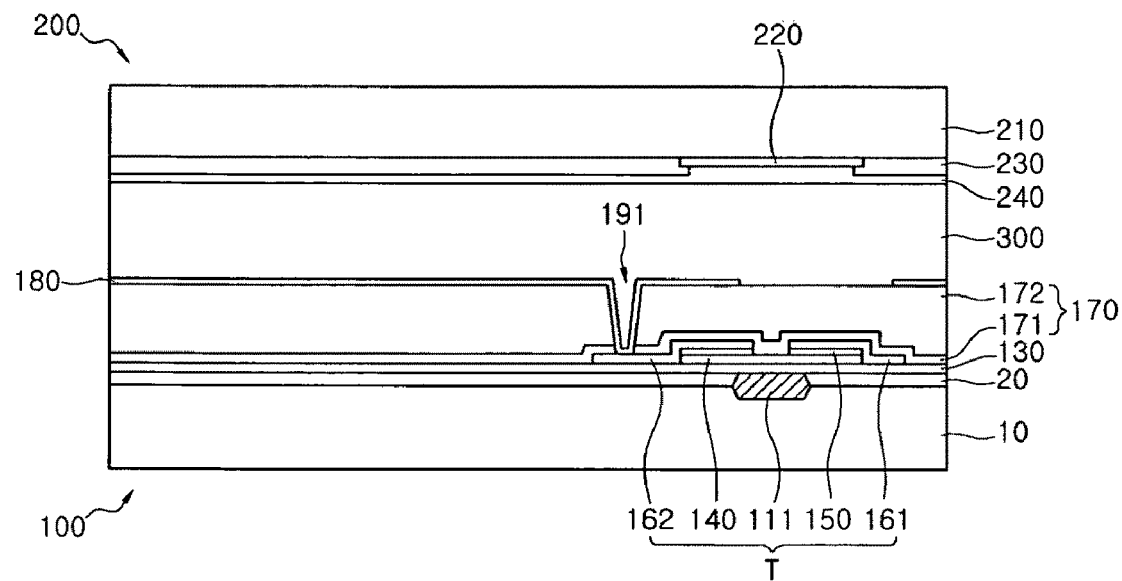
FIG. 8 illustrates a cross-sectional view taken along line II-II' of FIG. 6.
Figure 9:
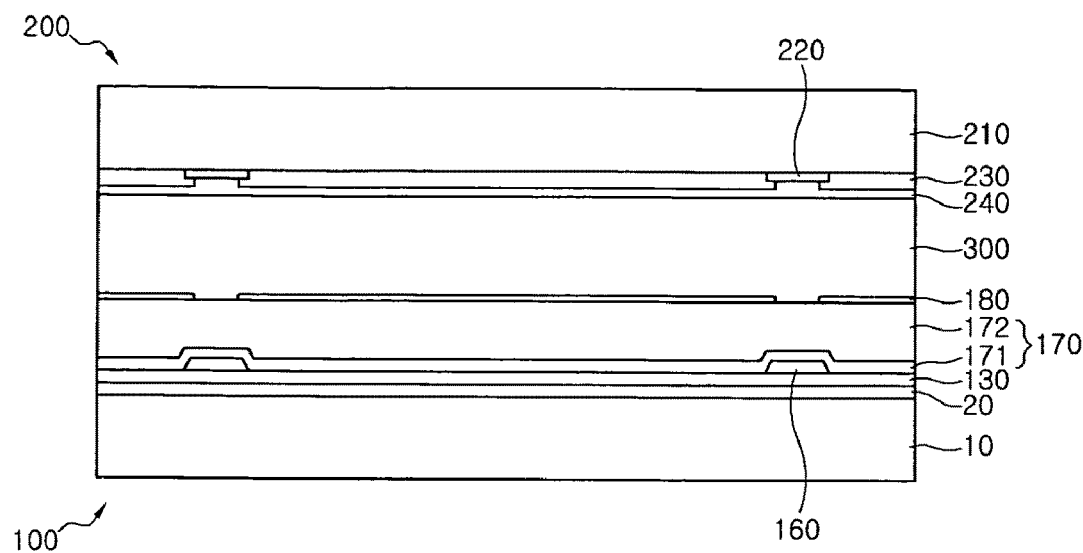
FIG. 9 illustrates a cross-sectional view taken along line III-III' of FIG. 6.

FIG. 6 illustrates a plan view of an LCD according to one or more embodiments of the present invention, and FIGS. 7, 8 and 9 illustrate cross-sectional views taken along lines I-I', II-II', and III-III', respectively, of FIG. 6.

Referring to FIGS. 6 through 9, the LCD may include a lower substrate 100, an upper substrate 200, and a liquid crystal layer 300 which is interposed between the lower substrate 100 and the upper substrate 200. The lower substrate 100 may include a plurality of buried-type gate lines 110, a plurality of data lines 160, a passivation layer 170, and a plurality of pixel electrodes 180, and the upper substrate 200 may include a plurality of color filters 230 and a common electrode 240.

More specifically, the gate lines 110 may be buried in a substrate 10, may be evenly spaced apart from one another, and may extend in a first direction. The data lines 160 may extend in a second direction and thus may intersect the gate lines 110. The data lines 160 may be isolated from the gate lines by a plurality of dielectric layer patterns 20 and a gate insulating layer 130. The passivation layer 170 may be formed on the data lines 160. The pixel electrodes 180 may be formed on the passivation layer 170. The lower substrate 100 may also include a plurality of TFTs T, which may be connected to the gate lines 110, the data lines 160 and the pixel electrodes 180.

The dielectric layer patterns 20 may be formed on the substrate 10, and may expose portions of the substrate 10 on which the gate lines 110 and a plurality of storage electrode lines 120 are to be formed. The width of upper portions of the hole in the dielectric layer patterns 20 may be less than the width of lower portions of the hole in the dielectric layer patterns 20, and the dielectric layer patterns 20 may expose the substrate 10. The thickness of the dielectric layer patterns 20 may be determined according to the thickness of the gate lines 110 and the storage electrode lines 120. The dielectric layer patterns 20 may include a transparent inorganic insulating layer such as a silicon oxide ($SiO_2$) layer or a silicon nitride (SiNx) layer.

The gate lines 110 may extend in the first direction, for example, in a row direction. The LCD may also include a plurality of gate electrodes 111, which may extend upwardly or downwardly from the gate lines 110. The gate lines 110 may be partially buried in the substrate 10. For example, the gate lines 110 may be formed to a thickness of about 4000-5000 Å, may be buried in the substrate 10 to a depth of about 2000 Å, and may protrude beyond the surface of the substrate 10 by about 2000-3000 Å. The height of the gate lines 110 may be less than the height of the dielectric layer patterns 20. The gate lines 110 may be formed so as to have uneven patterns.

The storage electrode lines 120 may be spaced apart from the gate lines 110. A storage electrode line 120 may extend in parallel with a pair of gate lines 110 and may be disposed either the same distance apart from each of the gate lines 110 or closer to one of the gate lines 110 than to the other gate line 110. The storage electrode lines 120 may be formed by the same process as that for the gate lines 110. The storage electrode lines 120 may have the same thickness and the same width as those of the gate lines 110. Alternatively, the storage electrode lines 120 may have a different width from that of the gate lines 110. The storage electrode lines 120 and the pixel electrodes 180, which are disposed on the opposite sides of the gate insulating layer 130, form storage capacitors together.

The gate lines 110 and the storage electrode lines 120 may be formed by forming the dielectric layer patterns 20, which may have holes having a cross sectional area decreasing with increasing distance away from the substrate 10, forming a trench in the substrate 10, and forming a metal layer in the trench through electroplating. The gate lines 110 and the storage electrode lines 120 may be formed of aluminum (Al), copper (Cu), neodymium (Nd), silver (Ag), chromium (Cr), titanium (Ti), tantalum (Ta), molybdenum (Mo), or an alloy thereof.

The gate insulating layer 130 may be formed on the substrate 10, on which the gate lines 110 and the storage electrode lines 120 are formed. That is, the gate insulating layer 130 may be formed on the dielectric layer patterns 20 and on the gate lines 110 and the storage electrode line 120, which may be exposed between the dielectric layer patterns 20. The gate insulating layer 130 may have a single-layer or multilayer structure including an inorganic insulating layer such as a silicon oxide ($SiO_2$) layer or a silicon nitride (SiNx) layer. The gate insulating layer 130 may be formed of the same material as that of the dielectric layer patterns 20.

Referring to FIG. 8, an active layer 140 may be formed of a first semiconductor material on part of the gate insulating layer 130 directly above a gate electrode 111, and an ohmic contact layer 150 may be formed of a second semiconductor material on the active layer 140. The first semiconductor material may include amorphous silicon, and the second semiconductor material may include silicide or n+ hydrogenated amorphous silicon doped with a high concentration of n-type impurities.

The data lines 160 may extend in a column direction, and thus may intersect the gate lines 110. Each of the data lines 160 may include a source electrode 161, which may extend from a corresponding data line 160, and a drain electrode 162, which may be spaced apart from the source electrode 161. The data lines 160, including the source electrodes 161 and the drain electrodes 162, may be formed of the same material as that of the gate lines 110 and the storage electrode lines 120, and may have a single-layer or multilayer structure. The data lines 160 may be formed so as to have uneven patterns.

The TFTs T enable the pixel electrodes 180 to be charged with a pixel signal, which may be applied to the data lines 160, in response to a signal applied by the gate lines 110. Each of the TFTs T may include a gate electrode 111, which may be connected to a gate line 110, a source electrode 161, which may be connected to a data line 160, a drain electrode 162, which may be connected to a pixel electrode 180, and a stack of a gate insulating layer 130, an active layer 140 and an ohmic contact layer 150, which may be formed between the gate electrode 111 and the source and drain electrodes 161 and 162. The ohmic contact layer 150 may be formed on the entire surface of the gate insulating layer 130, except for the channel areas.

The passivation layer 170 may be formed on the TFTs T and the data lines 160. The passivation layer 170 may include a photosensitive organic material having excellent planarization properties, a low-k dielectric material obtained by plasma-enhanced chemical vapor deposition (PECVD), or an inorganic material such as silicon nitride. The passivation layer 170 may include a first dielectric layer 171, which may be thinly formed of silicon nitride or silicon oxide, and a second dielectric layer 172, which may be thickly formed of an organic dielectric material. A plurality of color filters may be formed, instead of forming the second dielectric layer 172, thereby obtaining an LCD panel having a color filter-on-array (COA) structure.

Referring to FIG. 8, the passivation layer 170 may be partially removed, thereby forming a first contact hole 191, which exposes a drain electrode 162. Referring to FIG. 7, a second contact hole 192 may be formed through the passivation layer 170 and may expose part of the gate insulating layer 130 directly above a storage electrode line 120.

The pixel electrodes 180 may be formed on the passivation layer 170. Referring to FIG. 8, the pixel electrodes 180 may be connected to the drain electrodes 162 through the first contact hole 191. Referring to FIG. 7, the pixel electrodes 180 and the storage electrode lines 120, which may be disposed on the opposite sides of the gate insulating layer 130, form storage capacitors together.

In order to divide the liquid crystal layer 300 into a plurality of domains and adjust the orientation of liquid crystal molecules in units of the domains, the pixel electrodes 180 may include cut-out patterns (not shown) or protrusions (not shown). The cut-out patterns of the pixel electrodes 180 and cut-out patterns (not shown) of the common electrode 240 may divide the liquid crystal layer 300 into a plurality of domains.

The upper substrate 200 may include a plurality of black matrices 220, which may be selectively formed on a second insulating substrate 210, the color filters 230, which may be formed among the black matrices 220, and the common electrode 240, which may be formed on the entire surface of the second insulating substrate 210.

The black matrices 220 may be formed among a plurality of pixel regions. The black matrices 220 prevent light leakage into non-pixel regions and prevent the occurrence of optical interference between adjacent pixel regions. The black matrices 220 may be formed of a photosensitive inorganic material including a black pigment such as carbon black or titanium oxide. Alternatively, the black matrix 220 may be formed of a metal material such as Cr or chromium oxide (CrOx).

The color filters 230 may include red (R), green (G), and blue (B) filters, which may be alternately arranged among the black matrices 220. The color filters 230 generate various colors of light based on light emitted from a light source and transmitted through the liquid crystal layer 300. The color filters 230 may be formed of an organic material.

The common electrode 240 may be formed of a transparent conductive material such as indium tin oxide (ITO) or indium zinc oxide (IZO). The common electrode 240 may be formed on the black matrices 220 and the color filters 230. The common electrode 240 applies a voltage to the liquid crystal layer 300 together with the pixel electrodes 180 of the lower substrate 100. Cut-out patterns (not shown) may be formed on the common electrode 240. The cut-out patterns of the common electrode 240 and the cut-out patterns of the pixel electrodes 180 may divide the liquid crystal layer 300 into a plurality of domains.

FIGS. 10A through 10F illustrate cross-sectional views for explaining a method of fabricating the lower substrate 100 shown in FIG. 7; FIGS. 11A through 11F illustrate cross-sectional views for explaining a method of fabricating the lower substrate 100 shown in FIG. 8; and FIGS. 12A through 12F illustrate cross-sectional views for explaining a method of fabricating the lower substrate 100 shown in FIG. 9 according to one or more embodiments of the present invention.

Figure 10A:
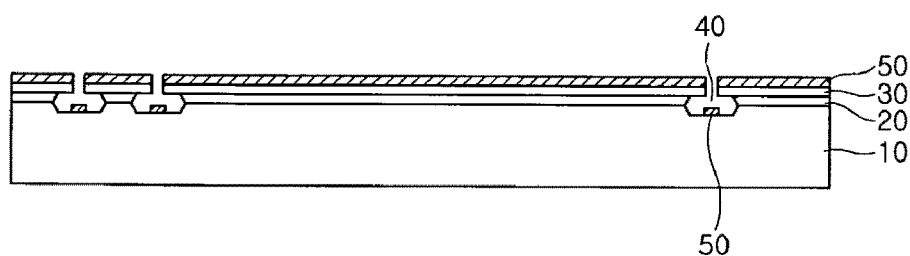
FIGS. 10A through 10F illustrate cross-sectional views for explaining a method of fabricating the lower substrate 100 shown in FIG. 7 according to one or more embodiments of the present invention.
Figure 11A:
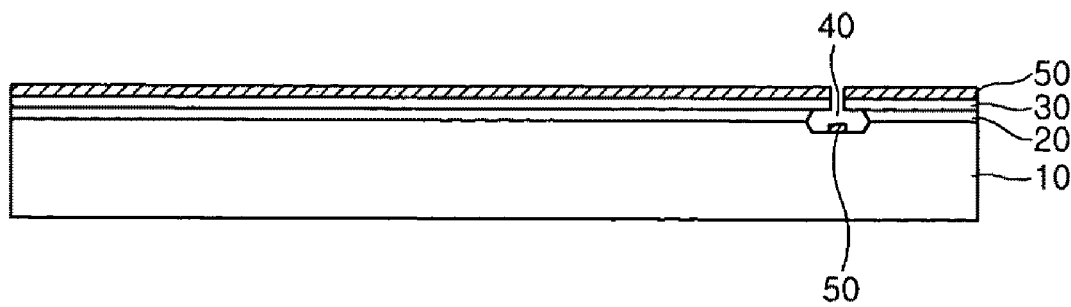
FIGS. 11A through 11F illustrate cross-sectional views for explaining a method of fabricating the lower substrate 100 shown in FIG. 8 according to one or more embodiments of the present invention.
Figure 12A:
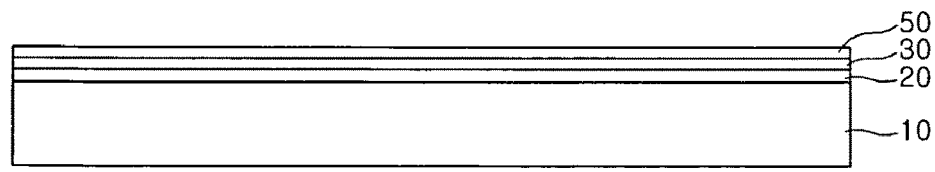
FIGS. 12A through 12F illustrate cross-sectional views for explaining a method of fabricating the lower substrate 100 shown in FIG. 9 according to one or more embodiments of the present invention.

Referring to FIGS. 10A, 11A, and 12A, a dielectric layer and a photosensitive layer may be sequentially formed on a substrate 10, and the photosensitive layer may be patterned by performing light exposure and development processes using a first mask. As a result, a plurality of photosensitive layer patterns 30 may be obtained. The photosensitive layer patterns 30 may expose portions of the substrate 10 on which gate electrodes 111, gate lines 110, and storage electrode lines 120 are to be formed. Dry etching may be performed on the dielectric layer using the photosensitive layer patterns 30 as masks, thereby generating undercuts below the photosensitive layer patterns 30 and obtaining a plurality of holes in the dielectric layer patterns 20 having a cross sectional area decreasing with increasing distance away from the substrate 10. Thereafter, a plurality of trenches 40 may be formed by etching the substrate 10. Thereafter, a seed layer 50 may be formed on the photosensitive layer patterns 30 and in the trenches 40 through sputtering.

In order to obtain the dielectric layer patterns 20, which have holes therein having a cross sectional area decreasing with increasing distance away from the substrate 10, a high-frequency power of 500-1500 W may be applied to an upper electrode of a plasma dry etching equipment at a pressure of 200-1000 mTorr. The dielectric layer may be etched for about 30-50 seconds using 200-500 sccm of an $SF_6$ gas, 50-200 sccm of an oxygen gas, and 100-300 sccm of an inert gas. In short, in order to obtain holes in the dielectric layer patterns 20 having a cross sectional area decreasing with increasing distance away from the substrate 10, the etching of the dielectric layer may be performed by appropriately adjusting at least one of pressure, high-frequency power, the amount of etching gas, and etching duration.

The trenches 40 may have a cross sectional area decreasing with increasing distance into the substrate 10 (i.e., may have a tapered shape), whereas the holes in the dielectric layer patterns 20 may have a cross sectional area decreasing with increasing distance away from the substrate 10 (i.e., may have an inversely tapered shape). The trenches 40 may be formed to a depth of about 1000-2000 Å in consideration of the amount by which the photosensitive layer patterns 30 are consumed during the etching of the substrate 10. The etching of the substrate 10 for forming the trenches 40 may be performed using a lower pressure, a higher frequency power, and a smaller amount of etching gas than those used for the etching of the dielectric layer patterns 20. For example, the substrate 10 may be etched for about 80-100 seconds by applying a high-frequency power of 2500-4000 W and a high-frequency power of 1500-2500 W to the upper and lower electrodes, respectively, at a pressure of 10-50 mTorr using a mixture of a fluorine-based gas, an oxygen gas and an inert gas as an etching gas, in particular, a mixture of 50-100 sccm of an $SF_6$ gas, 10-50 sccm of an oxygen gas and 30-100 sccm of an inert gas.

The seed layer 50 may be formed of a metal on the photosensitive layer patterns 30 and on exposed portions of the substrate 10 through sputtering. The seed layer 50 may be formed of Mo, Cu, Al, Ti, or an alloy thereof to a thickness of 300-700 Å.

Figure 10B:
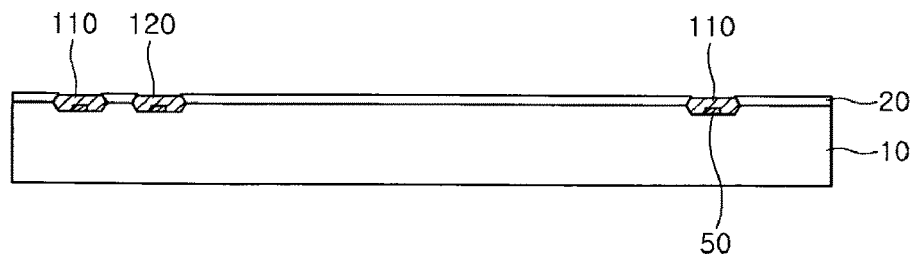
Figure 11B:
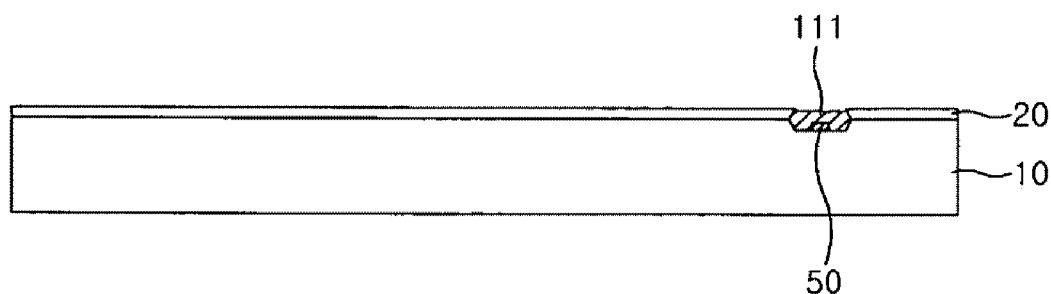
Figure 12B:
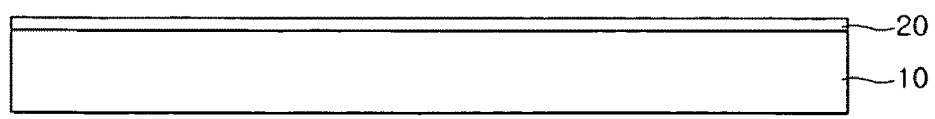

Referring to FIGS. 10B, 11B, and 12B, the photosensitive layer patterns 30 and portions of the seed layer 50 on the photosensitive layer patterns 30 may be removed by performing a lift-off operation. Thereafter, a metal layer may be formed on portions of the substrate 10 exposed among the dielectric layer patterns 20 by performing electroplating. Here, the metal layer may include the gate electrodes 111, the gate lines 110, and the storage electrode lines 120. The metal layer may be formed of metal materials including but not limited to Cu, or various alloys. In this manner, the metal layer may be grown from the seed layer 50 and may extend from the bottom of the trench 40 almost to the top of the dielectric layer patterns 20. Since the holes in the dielectric layer patterns 20 have a cross sectional area decreasing with increasing distance away from the substrate 10, the metal layer may be prevented from being excessively grown along the lateral surfaces of the dielectric layer patterns 20, and may thus be formed to a uniform thickness. Therefore, no edge build-up may occur. The height of the metal layer may be less than the height of the dielectric layer patterns 20. For example, the height of the metal layer may be about 500 Å less than the height of the dielectric layer patterns 20. As a result, a plurality of gate lines 1 10, which may be spaced apart from one another and extend in the row direction, and a plurality of gate electrodes 111, which extend from the gate lines 1 10, may be formed. In addition, a plurality of storage electrode lines 120 may be formed among the gate lines 110.

Figure 10C:
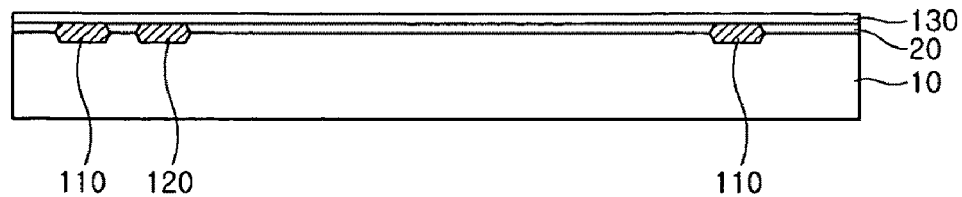
Figure 11C:
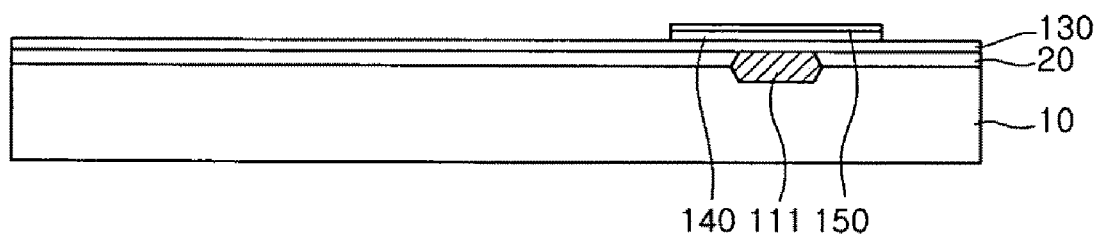
Figure 12C:
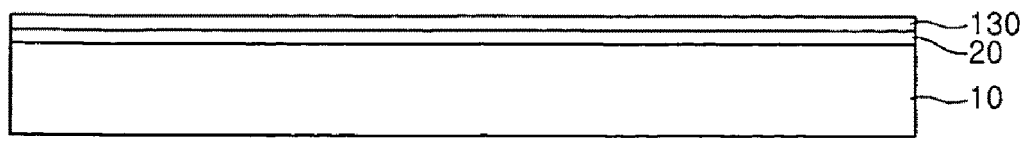

Referring to FIGS. 10C, 11C and 12C, a gate insulating layer 130 may be formed on the entire surface of the substrate 10. The gate insulating layer 130 may include an inorganic insulating layer such as a silicon oxide layer or a silicon nitride layer. Thereafter, an amorphous silicon layer may be formed on the entire surface of the gate insulating layer 130 as a first semiconductor layer, and a hydrogenated amorphous silicon layer doped with impurities may be formed on the first semiconductor layer as a second semiconductor layer. Thereafter, the first and second semiconductor layers may be patterned by performing photolithography using a second mask. As a result, an active layer 140 and an ohmic contact layer 150 may be formed and may overlap a gate electrode 111, as illustrated in FIG. 11C.

Figure 10D:
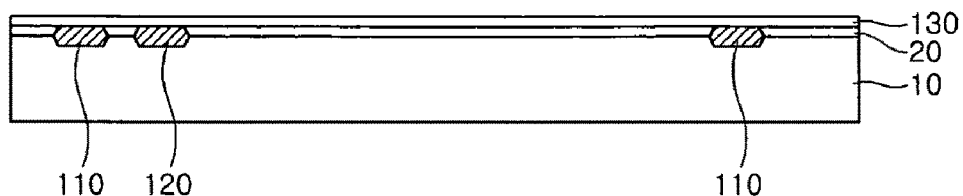
Figure 11D:
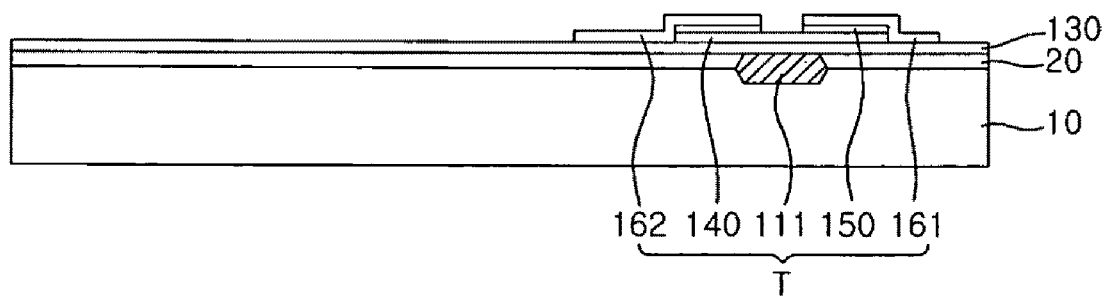
Figure 12D:
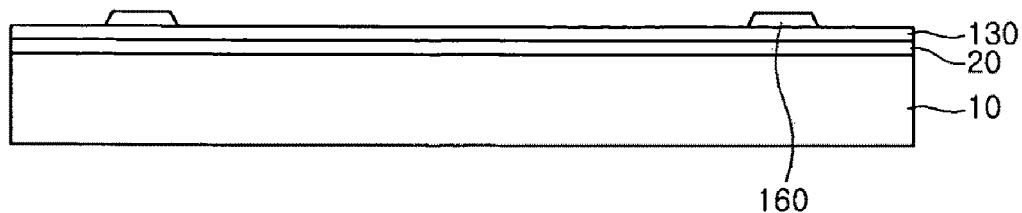

Referring to FIGS. 10D, 11D and 12D, a second conductive layer may be formed on the entire surface of the substrate 10. Thereafter, the second conductive layer may be patterned by performing photolithography using a third mask. As a result, a plurality of data lines 160, which are spaced apart from one another and intersect the gate lines 110, may be formed, as illustrated in FIG. 12D. In addition, a source electrode 161 and a drain electrode 162, which are spaced apart from each other, may be formed and may extend over the gate electrode 111, as illustrated in FIG. 11D. Referring to FIG. 11D, part of the ohmic contact layer 150 exposed between the source electrode 161 and the drain electrode 162 may be removed, and part of the active layer 140 exposed by the ohmic contact layer 150 may become a channel region. The second conductive layer may include a metal layer having a single-layer or multilayer structure.

Figure 10E:
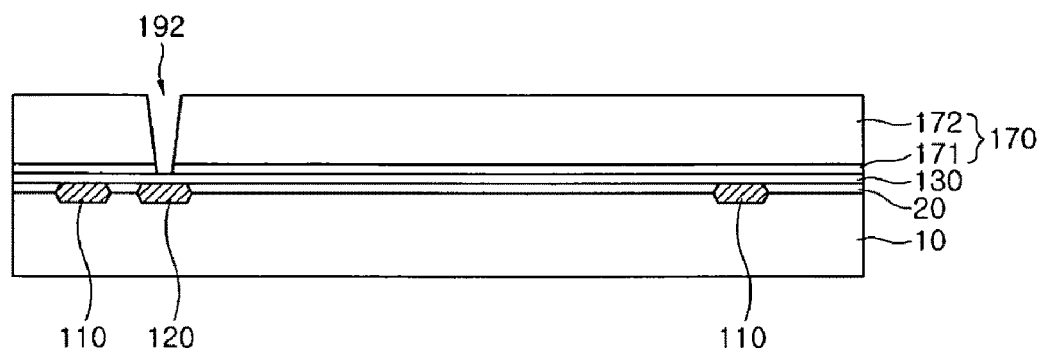
Figure 11E:
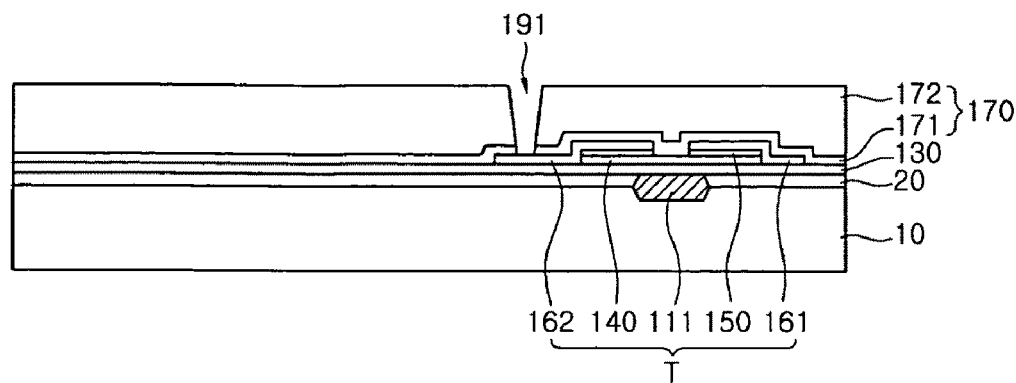
Figure 12E:
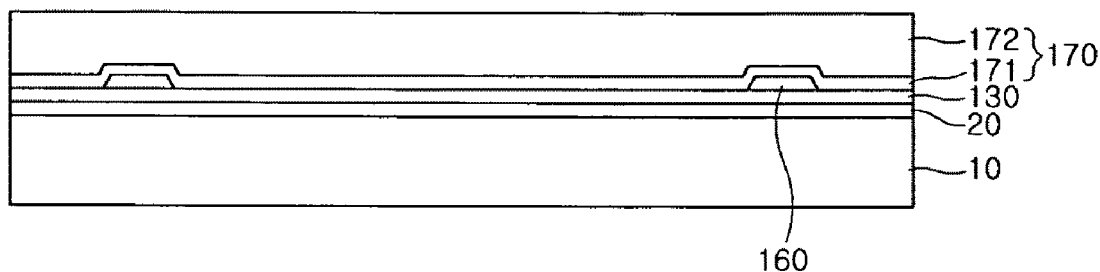

Referring to FIGS. 10E, 11E and 12E, a passivation layer 170 may be formed on the entire surface of the substrate 10. The passivation layer 170 may include a first dielectric layer 171, which may be thinly formed of silicon nitride or silicon oxide, and a second dielectric layer 172, which may be thickly formed of an organic dielectric material. Thereafter, the passivation layer 170 may be partially removed by performing photolithography using a fourth mask, thereby forming a first contact hole 191, which exposes a drain electrode 162, as illustrated in FIG. 11E, and a second contact hole 192, which exposes part of the gate insulating layer 130 directly above a storage electrode line 120, as illustrated in FIG. 10E.

Figure 10F:
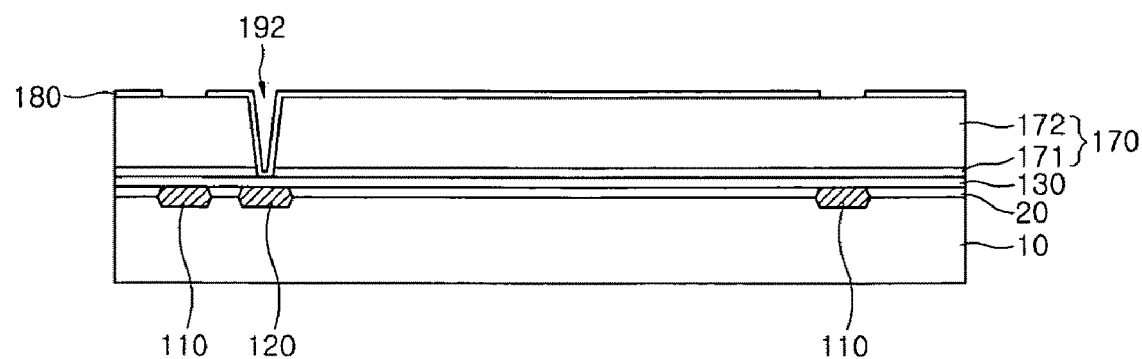
Figure 11F:
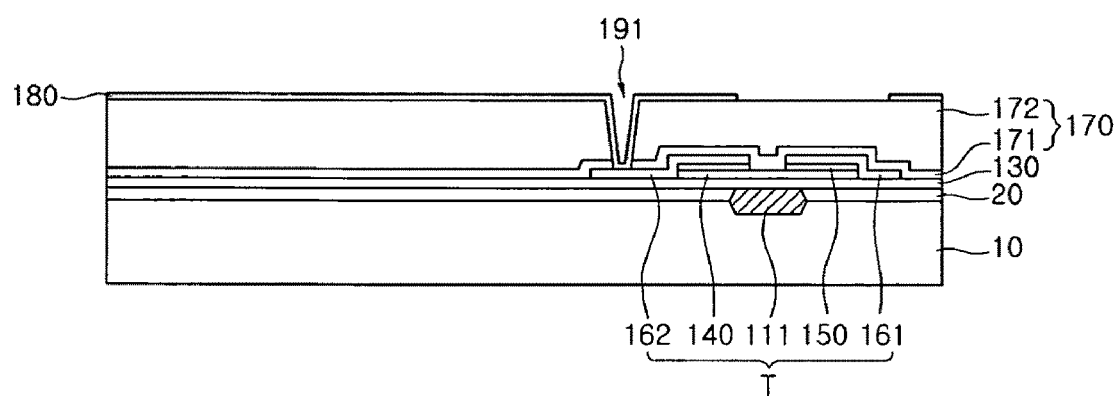
Figure 12F:
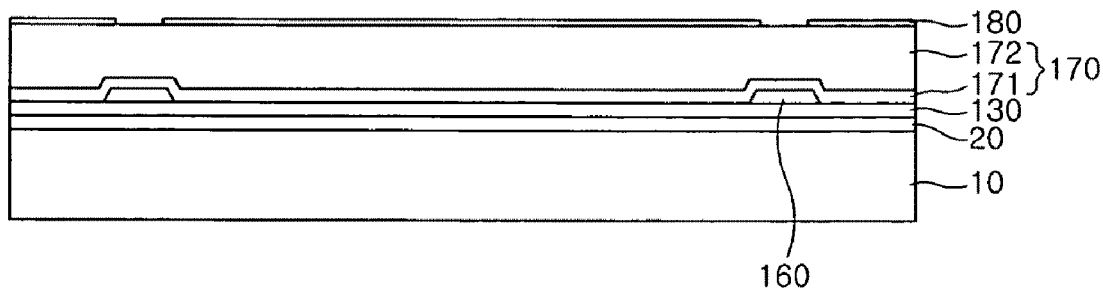

Referring to FIGS. 10F, 11F and 12F, a third conductive layer may be formed on the passivation layer 170. Thereafter, the third conductive layer may be patterned by performing photolithography using a fifth mask. As a result, a plurality of pixel electrodes 180 may be formed on the passivation layer 170. Referring to FIG. 11F, a pixel electrode 180 may be connected to a drain electrode 162 through the first contact hole 191. Referring to FIG. 10F, a pixel electrode 180 and a storage electrode line 120, which are disposed on the opposite sides of the gate insulating layer 130, may form a storage capacitor together.

Thereafter, a lower substrate, obtained using the method of fabrication of FIGS. 10A through 12F according to one or more embodiments of the present invention, may be coupled to an upper substrate, on which black matrices, color filters and a common electrode are formed, thereby fabricating an LCD.

In the exemplary embodiment of FIGS. 10A through 12F, gate lines are formed as buried-type metal wiring layers, which are buried in a substrate. However, embodiment of the present invention is not restricted to this exemplary embodiment. That is, data lines, instead of gate lines, may be formed as buried-type metal wiring layers. In this case, gate lines, a gate insulating layer, an active layer and an ohmic contact layer may be sequentially formed, and then a dielectric layer may be formed. A first dielectric layer of a passivation layer may be used as the dielectric layer. Thereafter, the gate insulating layer and the ohmic contact layer may be partially exposed by patterning the dielectric layer so as to have holes in the dielectric layer having a cross sectional area decreasing with increasing distance away from the substrate. Thereafter, a seed layer and a metal layer may be formed. In another embodiment, gate lines, in addition to the data lines, may also be formed as buried-type metal wiring layers.

The metal wiring layer according to embodiments of the present invention may be used in various display devices, other than an LCD, and may be suitable for use in the fabrication of buried-type gates of a semiconductor device.

According to the exemplary embodiments of the present invention, a dielectric layer may be formed on a substrate and then may be patterned, thereby obtaining a plurality of holes in the dielectric layer patterns having a cross sectional area decreasing with increasing distance away from the substrate. Thereafter, the substrate may be etched to form a trench. A metal wiring layer may then be formed by forming a metal layer so as to fill the trench and the hole between the dielectric layer patterns.

Therefore, it is possible to form a metal wiring layer having a thickness defined by the sum of the depth of a trench and the thickness of dielectric layer patterns and thus to provide a metal wiring layer having sufficiently low resistance.

In addition, according to the exemplary embodiments of the present invention, no step difference is generated during the formation of a buried-type metal wiring layer. Thus, it is possible to prevent the transmittance of a liquid crystal layer from decreasing due to a failure to properly fill liquid crystal molecules in the liquid crystal layer, and thus to increase the quality of display.

While exemplary embodiments of the present invention have been particularly shown and described, it will be understood by those of ordinary skill in the art that various changes in form and details may be made therein without departing from the spirit and scope of the present invention as hereinafter claimed.

What is claimed is:

1. A metal wiring layer comprising:
    a substrate on which a trench is formed, a cross sectional area of the trench decreasing with increasing distance into the substrate;
    a dielectric layer pattern and a hole therein formed on the substrate, wherein the hole in the dielectric layer pattern is connected with the trench, and a cross sectional area of the hole decreases with increasing distance away from the substrate; and
    a metal layer that fills the trench and the hole in the dielectric layer pattern, wherein a cross sectional area of the metal layer decreases with increasing distance into the substrate in the trench and with increasing distance away from the substrate in the hole, the metal layer contacts a first side wall of the hole and a second side wall of the hole, and the metal layer has a uniform height from the first side wall of the hole to the second side wall of the hole.

2. The metal wiring layer of claim 1, wherein a sidewall of the hole in the dielectric layer pattern forms an internal angle of about 90° or less with the substrate.

3. The metal wiring layer of claim 2, wherein the sidewall of the hole in the dielectric layer pattern forms an internal angle of about 5-85° with the substrate.

4. The metal wiring layer of claim 3, wherein a surface of the metal layer is level with or lower than the surface of the dielectric layer pattern, the surface of the metal layer being the surface of the metal layer that is farthest from the substrate.

5. The metal wiring layer of claim 1, wherein a top surface of the substrate contacts a bottom surface of the dielectric layer pattern, and a first cross section of the metal layer that is aligned with the bottom surface of the dielectric layer pattern is wider than all other cross sections of the metal layer that are parallel to the first cross section of the metal layer.

6. The metal wiring layer of claim 5, wherein each of the substrate and the dielectric layer pattern is a single-layer element.

7. A metal wiring layer comprising:
    a substrate;
    a dielectric layer pattern and a hole therein formed on the substrate, wherein the hole in the dielectric layer pattern extends to the substrate and a cross sectional area of the hole decreases with increasing distance away from the substrate; and
    a metal layer formed in the hole in the dielectric layer pattern, wherein a cross sectional area of the metal layer decreases with increasing distance away from the substrate, the metal layer contacts a first side wall of the hole and a second side wall of the hole, and the metal layer has a uniform height from the first side wall of the hole to the second side wall of the hole.

8. The metal wiring layer of claim 7, wherein a sidewall of the hole in the dielectric layer pattern forms an internal angle of about 90° or less with the substrate.

9. The metal wiring layer of claim 8, wherein the sidewall of the hole in the dielectric layer patterns forms an internal angle of about 5-85° with the substrate.

10. The metal wiring layer of claim 9, wherein a surface of the metal layer is level with or lower than the surface of the dielectric layer pattern, the surface of the metal layer being the surface of the metal layer that is farthest from the substrate.

11. The metal wiring layer of claim 7, wherein a top surface of the substrate contacts a bottom surface of the dielectric layer pattern.

12. A metal wiring layer comprising:
    a substrate on which a trench is formed;
    a dielectric layer pattern and a hole therein formed on the substrate, wherein the dielectric layer pattern includes a contact surface that contacts the substrate, the hole in the dielectric layer pattern is connected with the trench, and a cross sectional area of the hole decreases with increasing distance away from the substrate; and
    a metal layer that fills the trench and the hole in the dielectric layer pattern, wherein a cross sectional area of the metal layer decreases with increasing distance into the substrate in the trench and with increasing distance away from the substrate in the hole, and a first cross section of the metal layer that is aligned with the contact surface is wider than all other cross sections of the metal layer that are parallel to the first cross section of the metal layer.

13. The metal wiring layer of claim 12, wherein a sidewall of the hole in the dielectric layer pattern forms an internal angle of about 90° or less with the substrate.

14. The metal wiring layer of claim 13, wherein the sidewall of the hole in the dielectric layer pattern forms an internal angle of about 5-85° with the substrate.

15. The metal wiring layer of claim 14, wherein a surface of the metal layer is level with or lower than the surface of the dielectric layer pattern, the surface of the metal layer being the surface of the metal layer that is farthest from the substrate.

16. The metal wiring layer of claim 12, wherein a top surface of the substrate contacts a bottom surface of the dielectric layer pattern.

17. A metal wiring layer comprising:
a substrate on which a trench is formed;
a dielectric layer pattern and a hole therein formed on the substrate, the hole overlapping the trench, the dielectric layer pattern including a contact surface that contacts the substrate; and
a metal layer that fills the trench and the hole in the dielectric layer pattern, wherein a cross sectional area of the metal layer decreases with increasing distance away from a top surface of the substrate, and a first cross section of the metal layer that is aligned with the contact surface is wider than all other cross sections of the metal layer that are parallel to the first cross section of the metal layer.

18. The metal wiring layer of claim 17, further comprising a seed layer formed on a bottom surface of the trench, the seed layer being covered by the metal layer between the bottom surface of the trench and the metal layer.

19. The metal wiring layer of claim 17, wherein the metal layer is formed of aluminum (Al), copper (Cu), neodymium (Nd), silver (Ag), chromium (Cr), titanium (Ti), tantalum (Ta), molybdenum (Mo), or an alloy thereof.

20. The metal wiring layer of claim 17, wherein the top surface of the substrate contacts a bottom surface of the dielectric layer pattern.

* * * * *